United States Patent

Cusumano et al.

(10) Patent No.: US 6,567,752 B2
(45) Date of Patent: May 20, 2003

(54) GENERAL METHOD FOR TRACKING THE EVOLUTION OF HIDDEN DAMAGE OR OTHER UNWANTED CHANGES IN MACHINERY COMPONENTS AND PREDICTING REMAINING USEFUL LIFE

(75) Inventors: Joseph Cusumano, State College, PA (US); David Chelidze, Kingston, RI (US); Anindya Chatterjee, Bangalore (IN)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/930,386

(22) Filed: Aug. 15, 2001

(65) Prior Publication Data

US 2002/0046004 A1 Apr. 18, 2002

Related U.S. Application Data

(60) Provisional application No. 60/225,346, filed on Aug. 15, 2000.

(51) Int. Cl.[7] .............................................. G06F 19/00
(52) U.S. Cl. ........................................ 702/34; 702/116
(58) Field of Search ........................... 702/116, 34, 183, 702/182, 35, 44, 81.22, 71, 73, 129; 706/45, 16; 514/12, 285, 315, 311, 291; 432/197; 714/26; 345/474; 73/61.66; 600/484; 180/413; 273/362

(56) References Cited

U.S. PATENT DOCUMENTS 5,629,872 A  * 5/1997 Gross et al ................... 702/116
5,748,851 A  * 5/1998 Iokibe et al. ................... 706/45

OTHER PUBLICATIONS

Logan et al. "Using the correlation dimension for vibration fault diagnosis of rolling element bearings." *Mechanical Systems and Signal Processing.* (1996) 10(3), 241–250.

Wahab et al. "Damage detection in bridges using modal curvatures: Application to a real damage scenario." *Journal of Sound and Vibration.* (1999) 226(2), 217–235.

Alessandri et al. "Model–based fault diagnosis using non-linear estimators: a neural approach." *Proceedings of the American Control Conference.* Aluquerque, New Mexico, Jun. 1997, 903–907.

Li et al. "Adaptive prognostics for rolling element bearing condition." *Mechanical Systems and Signal Processing.* (1999) 13(1), 103–113.

Chelidze et al. "Hidden variable tracking: Formulation and analysis of a mathematical model." *Proceedings of the 1999 ASME Design Engineering Technical Conferences.* Sep. 12–15, 1999, Las Vegas, Nevada, USA, 1–11.

Li et al. "Stochastic prognostics for rolling element bearings." *Mechanical Systems and Signal Processing.* (2000) 14(5), 747–762.

(List continued on next page.)

*Primary Examiner*—John Barlow
*Assistant Examiner*—Xiuqin Sun
(74) *Attorney, Agent, or Firm*—Ohlandt, Greeley, Ruggiero & Perle, L.L.P.

(57) ABSTRACT

A method and apparatus for determining a slowly evolving damage state in a system having a time scale separation between a fast subsystem and a slow subsystem, the method includes acquiring measurement data of a fast subsystem of said system, determining a tracking function for the system, and evaluating the tracking function using the acquired measurement data to determine a measure of the slow damage subsystem the system.

20 Claims, 4 Drawing Sheets

OTHER PUBLICATIONS

Cornwell et al. "Application of the strain energy damage detection method to plate–like structures." *Journal of Sound and Vibration.* (1999) 224(2), 359–374.

Craig et al. "The use of correlation dimension in condition monitoring of systems with clearance." *Journal of Sound and Vibration.* (2000) 231(1), 1–17.

Dron et al. "Fault detection and monitoring of a ball bearing benchtest and a production machine via autoregressive spectrum analysis." *Journal of Sound and Vibration.* (1998) 218(3), 501–525.

Cusumano et al. "A nonlinear observer for damage evolution tracking." *Dept. of Eng. Sci. & Mech.*, Pennsylvania State University.

Feeny et al. "Parametric Identification of an Experimental Magneto–Elastic Oscillator." *Journal of Sound and Vibration.* 1–23.

Gertler, "Survey of model–based failure detection and isolation in complex plants." *IEEE Control Systems Magazine.* Dec. 1988, 3–11.

Fraser et al. Independent coordinates for strange attractors from mutual information. *Physical Revew A.* 33(2), Feb. 1986, 1134–1140.

Jeon et al. "Non–linear arx model–based kullback index for fault detection of a screw compressor." *Mechnical Systems and Signal Processing.* (1995) 9(4), 341–358.

Jiang et al. "The application of correlation dimension in gearbox condition monitoring." *Journal of Sound and Vibration.* (1999) 223(4), 529–541.

Liu et al. "Machinery diagnosis based on wavelet packets." *Journal of Vibration and Control.* 3:5–17, 1997.

Liu et al. "Detectionof roller bearing defects using expert system and fuzzy logic." *Mechanical Systems and Signal Processing.* (1996) 10(5), 595–614.

Lin et al. "Feature extraction based on morlet wavelet and its application for mechanical fault diagnosis." *Journal of Sound and Vibration.* (2000) 234(1), 138–148.

Li et al. "Fuzzy clustering for automated tool condition monitoring in machining." *Mechnical Systems and Signal Processing.* (1996) 10(5), 533–550.

Julier et al. "A new extension of the kalman filter to nonlinear systems." *The Robotics Research Group, Dept. of Engineering Science, The University of Oxford.*

Li et al. "Recurrent neural networks for fault diagnosis and severity assessment of a screw compressor." *DSC–vol. 61, Proceedings of the ASME Dynamic Systems and Control Division, ASME 1997,* 257–264.

Kennel et al. "Determining embedding dimension for phase–space reconstruction using a geometrical construction." *Physical Review A.* 45(6), Mar. 15, 1992, 3403–3411.

Mechefske. "Objective machinery fault diagnosis using fuzzy logic." *Mechanical Systems and Signal Processing.* (1998) 12(6), 855–862.

McGhee et al. "Neural networks applied for the identification and fault diagnosis of process valves and actuators." *Measurement.* 20(4), Apr. 1997, 267–275. (Abstract Provided).

Luo et al. "Real–time condition monitoring by significant and natural frequencies analysis of vibration signal with wavelet filter and autocorrelation enhancement." *Journal of Sound and Vibration.* (2000) 236(3), 413–430.

Messina et al. "Structural damage detection by a sensitivity and statistical–based method." *Journal of Sound and Vibration.* (1998) 216(5), 791–808.

Ma et al. "On localized gear defect detection by demodulation of vibrations–a comparison study." *Manufacturing Science and Engineering.* MED–vol. 2–1/MH–vol. 3–1, 565–576.

Pai et al. "Locating structural damage by detecting boundary effects." *Journal of Sound and Vibration.* (2000) 231(4), 1079–1110.

Qu et al. "Study and performance evaluation of some nonlinear diagnostic methods for large rotating machinery." *Mech. Mach. Theory.* 28(5), 1993, 699–713.

Ray et al. "Damage detection in smart structures through sensitivity enhancing feedback control." *Journal of Sound and Vibration.* (1999) 227(5), 987–1002.

Rivola et al. "Bispectral analysis of the bilinear oscillator with application to the detection of fatigue cracks." *Journal of Sound and Vibration.* (1998) 216(5), 889–910.

Ott. "Chaos in dynamical systems." *University of Maryland, College Park, Maryland, USA.* Cambridge University Press. 86–89.

Routolot et al. "Damage assessment of multiple cracked beams: Numerical results and experimental validation." *Journal of Sound and Vibration.* (1997) 206(4), 567–588.

Sampaio et al. "Damage detection using the frequency–response–function curvature method." *Journal of Sound and Vibration.* (1999) 226(5), 1029–1042.

Sauer et al. "Embedology." *Journal of Statistical Physics.* 65(3/4), 1991, 579–616.

Staszewski et al. "Time–frequency analysis in geabox fault detection using the wigner–ville distribution and pattern recognition." *Mechanical Systems and Signal Processing.* (1997) 11(5), 673–692.

Swanson et al. "Prognostic melelling of crack growth in a tensioned steel band." *Mechnaical Systems and Signal Processing.* (2000) 14(5), 789–803.

Takens. "Detecting strange attractors in turbulence." *Dynamic Systems and Turbulence, Warwick 1980.* Proceedings of a Symposium Held at the University of Warwick 1979/80. 376–381.

Wang et al. "Application of orthogonal wavelets to early gear damage detection." *Mechanical Systems and Signal Processing.* (1995) 9(5), 497–507.

Wang et al. "Early detection of gear failure by vibration analysis–I. Calculation of the time–frequency distribution." *Mechanical systems and Signal Processing.* (1993) 7(3), 193–203.

Wang et al. Early detection of gear failure by vibration analysis—II. Interpretation of the time–frequency distribution using image processing techniques.*Mechanical Systems and Signal Processing.* (1993) 7(3), 205–215.

Worden. "Structural fault detection using a novelty measure." *Journal of Sound and Vibration.* (1997), 201(1), 85–101.

Thyagarajan et al. "Detecting structural damage using frequency response functions." *Journal of Sound and Vibration.* (1998) 210(1), 162–170.

Worden et al. "Damage detection using outlier analysis." *Journal of Sound and Vibration.* (2000) 229(3), 647–667.

Doebling et al. "A summary review of vibration–based damage identification methods." *The Shock and Vibration Digest.* Mar. 1998, 91–105.

McFadden et al. "A signal processing technique for detecting loval defects in a gear from the signal average of the vibration." *Proc. Instn. Mech. Engrs.* 199(C4), 1985, 287–292.

Zou et al. "Vibration–based model–dependent damage (delamination) identification and health monitoring for composit structures–a review." *Journal of Sound and Vibration.* (2000) 230(2), 357–378.

Isermann. "Process fault detection based on modeling and estimation methods–a survey." 1984. 387–404.

Doebling et al. "Damage identification and health monitoring of structural and mechanical systems from changes in their vibration characteristics: A literature review." Los Alamos National Laboratories, Los Alamos, New Mexico 87545, LA–13070–MS, UC–900, Issued: May 1996, v–127.

Shives et al., Eds. "Detection, diagnosis and prognosis of rotating machinery to improve reliability, maintainability, and readiness through the application of new and innovative techniques." Cambridge University Press, 1988.

Moon et al. "A magnetoelastic strange attractor." *Journal of Sound and Vibration.* 65(2) 275–296. (Copy Not Provided).

Natke et al. "Model–aided diagnosis of mechanical systems: fundamentals, detection, localization, assessment." Springer–Verlag, Berlin, 1997. (Copy Not Provided).

Nijmeijer et al., Eds. "New directions in nonlinear observer design, lecture notes in control and information sciences." Section III—Fault Detection and Isolation, Springer–Verlag, London, 1999, 351–466.

Grewal et al. "Kelman filtering theory and practice." Prentice Hall, Inc. 1993. (Copy Not Provided).

* cited by examiner

GENERAL METHOD FOR TRACKING THE EVOLUTION OF HIDDEN DAMAGE OR OTHER UNWANTED CHANGES IN MACHINERY COMPONENTS AND PREDICTING REMAINING USEFUL LIFE

This application claims the benefit of Provisional application Ser. No. 60/225,346 filed Aug. 15, 2000.

BACKGROUND OF THE INVENTION

1. Field of the Invention

The present invention is related to a method for tracking the progression of damage and predicting the remaining useful life of machinery, and in particular pertains to tracking and predicting evolving "slow" damage using only readily available, directly observable "fast" quantities in systems having time scale separation.

2. Description of the Related Art

To stay competitive in modern, rapidly developing economies, industry strives to wholly utilize the useful life of their products and machinery without sacrificing environmental, personnel or consumer safety. The development of condition based maintenance and failure prediction technology addresses the important efficiency and safety issue aspects of using machinery to the fullest extent of its useful life. A problem exists in that most processes responsible for system (i.e., machine) failures are hidden from an observer. That is, the processes responsible for system failures are not directly observable. In many cases, the damage physics and/or an adequate mathematical representation of the system failure processes are not known. Even when the damage physics are known, it is usually difficult, if not impossible, to obtain a direct measure of the damage state of a particular machine without removing machinery from operation, and thus losing productivity.

As a matter of clarity, two of the main steps in the machinery condition monitoring problem are damage diagnosis and damage prognosis. In general, diagnosis encompasses damage detection, localization, and assessment. The step of damage prognosis includes the prediction of when the system will completely fail or the damage state of the system will reach a predetermined failure value. Prognosis is contingent on successful damage assessment. That is, given a successful estimate of the current damage state, and given a suitable damage evolution law, or means of determining such a law, a prediction of when the system will fail or when the damage state has reach a predetermined failure value is obtainable.

Most currently available condition monitoring technology focuses on diagnosis, particularly, damage detection. Several strategies exist for addressing the problem of damage detection. One approach is data based, or heuristic wherein one looks for changes due to the damage accumulation in time and/or frequency domain statistics of various types. For nonlinear systems exhibiting chaotic responses, it is customary to use estimates of long-time chaotic invariant measures, such as the correlation dimension or Lyapunov exponents. Other advanced techniques use expert systems or fuzzy logic and genetic algorithms. A feature of such methods is the simplicity with which they may be implemented, and that they can work very well at times. Most heuristic methods however serve as purely damage detection methods, that is, no damage state assessment is provided.

Even when the severity of damage can be estimated, it is usually difficult to establish a direct one-to-one connection between the damage state and the change in the heuristic statistic or feature vector There is no general theoretical basis for predicting a priori, without the benefit of a good model or experiment, whether any given feature vector will provide an adequate indication of the damage state for a particular system.

Another approach is model-based. The model-based approach addresses some of the shortcomings of the purely statistical approach discussed above, typically at the expense of more difficult development and implementation. In cases where an analytical (i.e., mathematical) model is available for the system under consideration, it may be possible to establish a functional connection between the drifting parameters and a particular feature vector. However, due to the general difficulty of developing physics-based mathematical models for many systems, such analytical models are not usually available.

The lack of an analytical model has been addressed by developing data-based models. The vast majority of model-based approaches have focused on linear systems. For linear systems, tools such as autoregressive models and/or frequency response functions have been used for fault detection in, for example, ball bearings.

Nonlinear systems on the other hand have been analyzed using neural networks. More recently, approaches have been developed that attempt to monitor damage using the asymptotic invariants of chaotic attractors. For example, estimates of the correlation dimension and Lyapunov exponents have been used to detect changes in the "chaotic signature" of the vibration signals from a damaged gearbox. However, while it is clear that such asymptotic invariants can be used to detect changes in a system caused by damage, they are unsuitable for actual damage tracking, since they do not vary monotonically with the hidden variable. This is a consequence of the fact that the asymptotic invariants do not vary smoothly with system parameters as the system passes through various bifurcations during the experiments. Futhermore, such methods depend on the existence of a chaotic response in the system being monitored.

Additional approaches have been based on various hybrids of methods including those discussed above, and others. In many cases, extensive attention has been given to the use of specific physical properties of structures for damage detection and identification, such as, most notably, mode shapes. A disadvantage of many of such methods for damage diagnostics, however, is that they are highly application dependent.

The failure prognostics problem, by itself, is still in the developmental stages. Currently available prognostic methods can be divided into methods based on deterministic and probabilistic or stochastic modeling of fault or damage propagation. Such methods are still application dependent, since they are closely tied to a particular damage detection problem. In addition, these methods cannot be considered general or comprehensive solutions, since their applicability is contingent upon successful damage state assessment that is provided by some suitable damage detection method.

It is therefore an object of the present teachings to provide a method of damage diagnosis and prognosis that addresses the foregoing and other problems and limitations of available technologies.

SUMMARY OF THE INVENTION

The present invention pertains to a general purpose machinery diagnostic and prognostic method and apparatus for tracking and predicting evolving damage using only available "macroscopic" observable quantities. The damage is considered as occurring in a hierarchical dynamical system including a directly observable, "fast" subsystem that is coupled with a hidden, "slow" subsystem describing damage evolution. In one aspect thereof, the method provides damage diagnostics in the form of continuous "gray-scale" estimates of current machine health (or, equivalently, damage state), and failure prognostics accomplished using measurements from the fast subsystem and a model of the slow subsystem.

Damage tracking is accomplished using a two-time-scale modeling strategy based on appropriate state-space modeling of the fast subsystem. In particular, short-time predictive models are constructed using data obtained from the reference (e.g., undamaged) fast subsystem. Fast-time data for the damaged system is then collected at future times, and used to estimate the short-time reference model prediction error (i.e., STIRMOP). The STIRMOP over a given data record is used to generate a tracking metric, or measure, of the current damage state using a linear recursive estimator. Recursive, nonlinear filtering is then used on the estimated damage state to estimate the remaining useful life of the machinery component.

Due to its general formulation, the present invention is applicable to a wide variety of systems possessing drastically different damage physics. For example, the method can be applied to vibrating structural systems (such as, for example, beams and trusses) with cracks that grow to complete failure; gears with failing teeth; electromechanical systems with failing batteries or other power sources; electrical systems with failing or degrading discrete components such as resistors or capacitors; or precision machinery that is gradually drifting out of alignment.

The present invention is capable of providing accurate predictions of remaining useful life, in real-time, beginning in advance of the final, complete failure of the system. The present method generates a feature vector of a particular and novel type, the short time reference model prediction error, or STIRMOP. Unlike arbitrary feature vectors used in other conditioning monitoring approaches, the evolution of the STIRMOP in time can be directly and unambiguously related to changes in the hidden damage state of the system. Thus, using the STIRMOP feature vector, it is possible to give a continuous (i.e., real time) presentation of the current state of damage in the system. The present method does not merely indicate that a machine is no longer operating normally, but provides "gray-scale" damage information, indicating the current degree of damage compared to the initial state of the machine. In other words, using STIRMOP it is possible to track the evolution of damage in the system.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
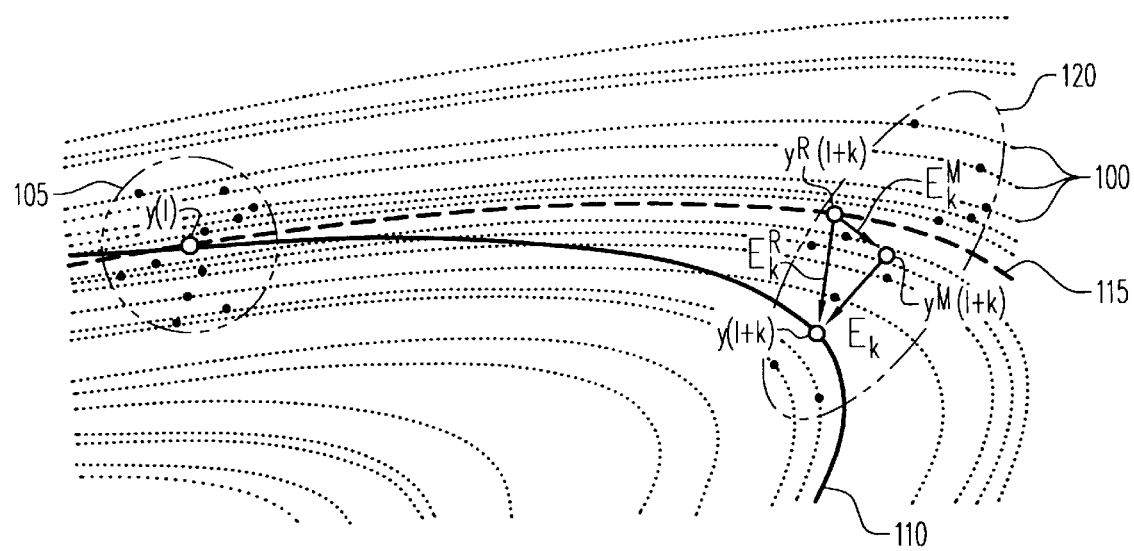
FIG. 1 is a depiction of the tracking function metric estimation used by the present invention.

The present invention pertains to a damage diagnostics and prognostic method that overcomes many of the aforementioned problems using a mathematical formulation of the damage evolution problem in state space. The hidden damage process is considered as evolving in a hierarchical dynamical system including a "fast" subsystem coupled to a "slow" subsystem having the form:

$$\dot{x}=f(x,\mu(\phi)),t) \tag{1a}$$

$$\dot{\phi}=\epsilon g(x,\phi,t) \tag{1b}$$

where: $x \in R^n$ is the fast, directly observable dynamic variable; $\phi \in R^m$ is the slow dynamic variable (i.e., the "hidden" damage state); the parameter vector $\mu \in R^p$ is a function of $\phi$; t is time; and $0<\epsilon<<1$ defines the time scale separation between the fast dynamics and slow drift. Equation (1b) is a rate law. The fast subsystem (1a) is quasistationary over short times, but nonstationary over long periods of time, $t=o(1/\epsilon)$. Note, it is assumed that at least some sufficiently smooth functional combination of $x \in R^n$ components can be measured.

If $\epsilon$ were exactly zero, then $\mu(\phi)=\mu_0$ would be a constant vector of the parameters in Eq. (1a); and since $\epsilon$ is very small as described above, Eq. (1a) may be considered as a model for a system with slowly drifting parameters.

The present method is appropriate for systems where hidden processes responsible for unwanted changes in a system evolve on a much slower time scale than the observable dynamics. The observable dynamics can be measured on-line (i.e., in real time). The required time scale separation is common for dynamical systems with evolving damage processes. For example, a crack growth (i.e., damage state) in a spinning shaft can be characterized by a time scale of hours, days, weeks or even years (i.e., a "slow" time), while a time scale of the shaft's vibration signature (i.e., reference) is characterized by milliseconds or seconds (i.e., a "fast" time).

The diagnostics and prognostic aspects of the present invention are such that it is a full state space method that provides the status of a machine or system and predicts a damage state or failure. In one aspect of the present invention, and as an overview, the method includes three major steps. The details of the method will be described in greater detail below. A first step includes a short-time prediction module that uses an appropriate form of state space reconstruction to develop a reference model for the fast subsystem in its initially undamaged (i.e., healthy) state (see Eq. (1a)). The reference model is used to generate short-time reference model prediction error (STIRMOP) statistics using future system fast-time data. The second step uses the STIRMOP error statistics to obtain a measure of the damage state, $\phi$, using a linear recursive estimator such as, but not limited to, a Kalman filter. The third step uses the output of a damage tracker to predict the remaining time to failure using both nonlinear and linear recursive estimators.

In an aspect of the present invention, the hidden damage, described by Eq. (1b) is assumed to evolve according to dynamical relationship, such as a piecewise power-law model, the parameters of which can be estimated on-line as part of the diagnostic and prognostic process. The damage evolution model is assumed to be known a priori. Accordingly, the damage evolution model determination and/or generation is not a necessary step in the method of the present invention.

A fundamental idea behind tracking aspect of the present method can be illustrated by considering a dynamical system described by Eqs. (1a) and (1b), having a fixed damage state vector (i.e., no evolving damage or $\epsilon=0$). For fixed initial conditions specified at a time coordinate $t=t_0$ and a space coordinate $x=x_0$, and at some future time $t_0+t_p$, the state of the system is:

$$x(t_0 30\ t_p) = X(x_0, t_0, t_p; \mu(\phi)). \tag{2}$$

If $t_0$, $t_p$, and $x_0$ are fixed, then X is purely a function of $\mu(\phi)$ that describes a p-parameter surface in $R^n$ space.

In principle, the value of $X(\mu(\phi))$ can be evaluated for every $\phi$, and given certain yet to be determined observability conditions, mappings $X^{-1}(\mu): R^n \rightarrow R^p$ or $X^{-1}(\phi): R^n \rightarrow R^m$ required for true tracking can be constructed. Therefore, if the function $X(\mu(\phi))$ can be determined experimentally, it can subsequently be used to determine $\mu(\phi)$ or $\phi$, provided the observability conditions are satisfied.

Now, consider the case of $\epsilon \neq 0$, that is, the case wherein damage is evolving in the system. For $0 < \epsilon << 1$, $\phi$ cannot be treated as a parameter and, in this case, the complete state of the system (Eqs. (1a) and (1b)) is the pair (x, $\phi$). However, for $t_p << 1/\epsilon$, it can be assumed that $\phi = \phi_0 + o(\epsilon)$. Now, the state of the fast subsystem can be written as:

$$x(t_0 + t_p; \varepsilon) = X(x_0, \mu(\phi_0), t_0, t_p), \tag{3}$$
$$= X(x_0, t_0, tp; \mu(\phi_0)) + O(\varepsilon),$$
$$= X(x_0, t_0, t_p; \mu(\phi_R)) + \frac{\partial X}{\partial \mu}\frac{\partial \mu}{\partial \phi}(\phi_0 - \phi_R) +$$
$$O(\|\phi_0 - \phi_R\|^2) + O(\varepsilon),$$

where on the third line we have Taylor expanded expression about $\phi_R = \phi(t_R)$, the reference (i.e., healthy) value of the damage state variable for some reference time $t_0 = t_R$. Then, for fixed coordinates $x_0$, and $\phi_R$ and fixed $t_p$, we define a tracking function based on the short-time reference model prediction error (i.e., STIRMOP) as follows:

$$e = X(x_0, \mu(\phi_0), t_0, t_p) - X(x_0, \mu(\phi_R), t_0, t_p), \tag{4}$$
$$= \frac{\partial X}{\partial \mu}\frac{\partial \mu}{\partial \phi}(\phi_0 - \phi_R) + O(\|\phi_0 - \phi_R\|^2) + O(\varepsilon),$$

where the coefficient matrices in the Taylor expansion are evaluated with the initial conditions $x(t_0) = x_0$, and $\phi = \phi_R$ Now, it is clear that the observability condition is that the matrix $$\frac{\partial X}{\partial \mu}\frac{\partial \mu}{\partial \phi}$$

must have maximal rank. That is, we should have n>p>m, in addition to Range $$\left(\frac{\partial X}{\partial \mu}\right) \in R^n$$

and Range $$\left(\frac{\partial \mu}{\partial \phi}\right) \in R^p$$

having dimensions p and m, respectively.

Assuming that the linear operator in the first term of the Taylor expansion of Eq. (4) has maximal rank, we expect the output of the tracking function to be an affine transformation of the change in the damage variable (i.e., linear observability):

$$e = C(x_0, t_0, t_p)\phi_0 + c(x_0, t_0, t_p; \varepsilon) \tag{5}$$

where $$C = \frac{\partial X}{\partial \mu}\frac{\partial \mu}{\partial \phi}$$

is an n×m matrix, $$c = \frac{\partial X}{\partial \mu}\frac{\partial \mu}{\partial \phi}\phi_R + O(\|\phi_0 - \phi_R\|^2) + O(\varepsilon) \text{ is an } n \times 1 \text{ vector.}$$

Direct implementation of the basic STIRMOP formula of Eq. 5 is unfortunately not adequate to achieve good damage tracking. In an experimental context, the procedure illustrated above is prone to errors. It is usually not possible to repeatedly start the system from the same initial condition. Furthermore, the observability conditions typically depend on $x_0$, $t_0$ and $t_p$. Thus, it is necessary to use many values of $x_0$ and/or $t_0$ and/or $t_p$ to deal with this repeatability problem, as well as to increase the robustness of the method.

To actually calculate the tracking function e, it is necessary to know how the fast subsystem evolves over the time interval $t_p$ for the current value of $\phi_0$, as well as how the fast subsystem would have evolved for the reference value of $\phi_R$, both evolving from same initial condition $x_0$. Since the system's fast behavior for the current damage state characterized by $\phi_0$ is directly measurable (i.e., we can reconstruct the fast dynamics using a sensor measurement of the fast subsystem), the strategy used in the present invention is to compare the current damage state of the fast subsystem to the predictions of a reference model describing the fast subsystem behavior for the $\phi = \phi_R + o(\epsilon)$.

In order to construct the reference model, data from the system in its reference (nominally undamaged or "new") condition is used to determine a suitable state space. The process of determining the suitable state space is referred to herein as the process of "state space reconstruction." A general class of state space models appropriate to the system under consideration is also selected in accordance with the present invention.

As a matter of clarity and context, we assume that a scalar time series measured from the fast subsystem Eq. (1a) are sampled with sampling time $t_s$ and collected in records of size $t_D = M\ t_s$. The total data collection time, $t_T$, does not necessarily equal $N_T t_D$, where $N_T$ is the total number of data records. Note, $t_T \geq N_T t_D >> t_s$ since there may be time gaps between the data records.

It is also assumed that the rate of damage accumulation is very slow, so that, $t_D << 1/\epsilon$. Thus, the total change in the damage variable $\phi$ is very small over any data collection time span $t_D$, and for any $t_0$ in the interval defined by $t_D$, and thus it can be written $\phi = \phi_0 + o(\epsilon) \approx \phi_0$. Thus, given the assumption of the fast subsystem being quasistationarity over any single data collection interval, hereinafter the subscript zero is neglected from $\phi$.

If the system being considered exhibits chaotic motion in its reference state, the well-known property of chaotic attractors of exploring a relatively large region of state space can be effectively used for the state-space reconstruction using delay coordinate embedding. More generally, a reference model valid over a given portion of state space can be obtained by repeatedly starting the reference subsystem from randomly or stochastically generated initial conditions that adequately cover the region of interest (e.g., by stochastic interrogation).

For systems known to be linear, suitable state vectors can be obtained using delayed coordinates selected using, for example, formal optimal order methods or even trial and error. If necessary or convenient, inputs can be included in the reconstructed state variables. Thus, in principle, the same tracking procedure described herein can be applied to study arbitrary global behaviors (including multiple coexisting periodic orbits and random excitation) for a variety of systems, both linear and nonlinear.

Using delay reconstruction, a scalar time series $\{x(n)\}_{n=1}^M$ from the reference system is used to reconstruct a state space of appropriate dimension (e.g., d) for the system. In the reconstructed state space, the scalar time series is converted to a series of vectors $y^T(n)=(x(n), x(n+\tau), \ldots, x(n+(d-1)\tau)) \in R^d$, where $\tau$ is a suitable delay parameter. Embedding parameters $\tau$ and d can be determined using trial and error, or, more formally using, for example, the first minimum of average mutual information and false nearest neighbors methods, respectively, or some equivalent method.

The reconstructed state vectors are governed by a difference equation of the form $y(n+1)=P(y(n); \phi)$. The observation period $t_p$ corresponds to picking an integer k (such that $t_p=kt_s$). One is interested in the $k^{th}$ iterate of the map P:

$$y(n+k)=P^k(y(n);\phi). \tag{6}$$

The models defined by Eq. (6) show how neighborhoods about each data point are mapped forward in time. For known linear systems, Eq. (6) can be assumed to have the form of an autoregressive model (of ARMA, ARMAX or similar type). For nonlinear systems, local linear, radial basis function, or similar type models, including neural networks, can be used.

As an illustrative example, and not as a limitation, the simplest such model is a local linear model relating the state $y(n)$ at time n, to the state $y(n+k)$ at time n+k:

$$y(n+k)=A_n^k y(n)+a_n^k=B_n^k \hat{y}(n), \tag{7}$$

where the model parameter matrix $A_n^k$ and parameter vector $a_n^k$ are determined by regression at each point in the data set, and where $$\hat{y}(n)=[y^T(n),1]^T, \text{ and } B_n^k=[A_n^k | a_n^k]. \tag{8}$$

Referring to FIG. 1, some of the basic ideas of the STIRMOP-based tracking function estimation used herein are shown. In a first step, a large reference data set is collected and the initial state space reconstructed. The reference trajectories are shown by the lines 100. Then, a large number of initial points y(l) (l=1, 2, . . . ), and corresponding points after k steps, y(l+k), are experimentally obtained for the "changed" system. N points in the reference set 105 forming the nearest neighbors of each point y(l) and corresponding N reference data (in set 120) points k steps later are used. Based on the N reference points, the reference model for each point y(l) is obtained as described above.

In the reference system, the same initial points y(l) will be mapped to points $y^R(l+k)$. Since we have an imperfect reference model, it actually maps the points to some other points $y^M(l+k)$. The following "error" vectors are introduced to account for the differences. Note, for purposes of clarity, the dependence of the errors (E) on l is suppressed in the FIG. 1:

$$E_k^R(l)=y(l+k)-y^R(l+k), \text{ the true error,} \tag{9a}$$

$$E_k(l)=y(l+k)-y^M(l+k), \text{ the estimated error,} \tag{9b}$$

$$E_k^M(l)=y^M(l+k)-y^R(l+k) \text{ the modeling error.} \tag{9c}$$

As shown in FIG. 1 trajectories of the reference system in state space are shown in thin, light (i.e., gray) lines 105. The thick, solid black line represents a measured trajectory of the perturbed system, passing through y(l), and the dashed line represents where a trajectory would have gone (i.e., a prediction) in the reference system if starting from the same point y(l).

The tracking function (Eq. 4) for initial point y(l) in the reconstructed state space can be estimated as $$e_k(l)=P^k(y(l),\phi)-P^k(y(l),\phi_R)=E_k^R(l),=E_k(l)+o(E_k^M(l)). \tag{10}$$

As discussed earlier, we are interested in estimating the slow damage variable $\phi$. As clearly seen from the above equations, estimating the slow damage variable $\phi$ requires an estimate of $e=E_k^R$. However, only the estimated error $E_k(l)$ can be measured. Thus, what is needed is a method for estimating the true error $E_k^R$ given only $E_k(l)$.

Furthermore, the above Eq. (10) uses the information of only one point in the state space (as indicated by the index l), whereas it is desired to use all of the data available within one data record. Both of these issues can be addressed by using an appropriate filter, which will be discussed in greater detail below.

To use the data from an entire data record, and to eliminate the sources of error discussed earlier, instead of using the STIRMOP directly, we consider instead the tracking metric $$e_k=\langle \|E_k^R(l)\| \rangle \tag{11}$$

$$=\langle F(\|E_k(l)\|) \rangle \tag{12}$$

where the angle brackets $\langle \ \rangle$ represent the root mean square (RMS) value over an entire data record of time span $t_D$ and F is a suitably chosen filter While the filter F may be designed using an explicit analytical model for the fast subsystem described by Eq. (1a), in the case considered here we have assumed that such a model is not available. However, considering that the fast sampling time $t_s << t_D << 1/\epsilon$, a constant model provides an acceptable approximation to the tracking function evolution over one sampling time interval $t_s$. That is, over the relatively short sampling time, the best estimate of the future "error state" one sample step ahead, $\|E_k^R(l+1)\|$, is its current value, $\|E_k^R(l)\|$, which is, obviously, a linear relationship.

Given this simple constant model of the STIRMOP over one sample step, the filter F is chosen to be a Kalman filter. The linear process difference equation for the scalar tracking function $E(l) \equiv \|E_k^R(l)\|$ and scalar measurement function $z(l) \equiv \|E_k(l)\|$ is then:

$$E(l+1)=E(l)+w(l+1), z(l+1)=E(l+1)+v(l+1), \tag{13}$$

where the process (model) noise w(l) and measurement noise v(l) are assumed to be white, independent random variables with Gaussian distributions p(w)~N(0, Q) and p(v(l))~N(0,R(l)).

Herein, the constant Q corresponds to the average amplitude of fluctuations in $\|E_k^R(l)\|$ as the location in state space changes along a given trajectory. In addition, R(l) corresponds to fluctuations in $\|E_k^R(l)\|$ due to changes in the local linear model accuracy from point to point in state space. R(l) $r_l^{d_f}$ is chosen such that $r_l$ is the distance from the point y(l) to the farthest of all N nearest neighbors used for local modeling, and $d_f$ is the estimated dimension of the data in the reference state space, i.e., average point-wise dimension. This choice is used since the accuracy of the local linear models is proportional to the generalized volume occupied by the fixed number of nearest neighbors, and the volume by itself scales like the $r_l$ raised into the $d_f$ power.

The tracking function filter time and measurement update equations are constructed following standard Kalman filter theory. Note, the Kalman filter assumes that w(l) and v(l) have normal distributions. Statistical characteristics of the tracking function output most likely will not be Gaussian since they are an outcome of a nonlinear process. In practice, very few processes possess noise terms that are normally distributed and, in case the deviation is due to some nonlinear measurement function, the inverse transform may be found to get Gaussian variables. If such a transform cannot be found, Kalman filtering is still used since it provides an accurate estimate of the first two moments of the distributions. Furthermore, as shown in the example presented below, in this application it is found that ln (E(l)) is approximately normal, and thus satisfactory results are obtained by replacing E(l) by ln(E(l)) in Eqs. 13.

For each data record, the damage tracking metric $e_k$ and its variance are then estimated as, $$e_k = \langle \hat{E}(l) \rangle, \text{ and } \sigma_{e_k}^2 = \langle (\hat{E}(l) - e_k)^2 \rangle. \quad (16)$$

This completes the damage tracking portion of the method.

Following Eq. (5), and assuming linear observability, $e_k$ is a linear function of $\phi$. Given a damage evolution law in terms of $\phi$, the current damage state can be estimated based on estimates of $e_k$ using an extended Kalman or some other nonlinear recursive filter. Given a failure value (surface) of the damage variable, the damage model and estimated current damage state can be used to estimate the remaining time-to-failure, according to different variants of the general method, as will be described.

As considered herein, it is assumed that the form of the "damage" model is known from previous calculations or is determined a posteriori, after initial runs of the tracking procedure. For concreteness, in the following discussion we assume the use of a piecewise power law of the form:

$$\frac{d\phi}{dt} = \varepsilon\phi^\alpha, \quad (17)$$

or in discrete form:

$$\phi(l+1) = \phi(l) + \Delta t \varepsilon \phi(l)^\alpha. \quad (18)$$

We also assume that the parameters of this model known a priori. For the sake of conciseness and clarity of presentation, the case of scalar $\phi$ is presented. It is noted however that this is neither a requirement nor a limitation of the present invention.

In general, the exact form of the damage model will depend on the application, although the form of Eq. 17 is applicable in many cases of practical interest. For example, in the case of a battery discharge tracking and prediction, in which "damage" refers to the loss of voltage in the battery, a suitable model has been shown to replace the right hand side of Eq. 17 with a specific cubic function of $\phi$.

The estimated tracking metric $e_k(l)$ is used as a measurement $z_\phi(l)$ of the actual damage state $\phi(l)$. Thus our discrete-time process and measurement equations for the damage state are:

$$\phi(l+1) = \phi(l) + \Delta t \varepsilon \phi(l)^\alpha + w_\phi(l+1), \; z_\phi(l+1) = C\phi(l+1) + c + v_\phi(l+1), \quad (19)$$

where $\Delta t = Mt_s = t_D$ for consecutive data records with no gaps; C and c are scalar parameters as per Eq. (5); and the process noise $w_\phi$ and measurement noise $v_\phi$ are assumed to be white Gaussian distributions $p(w_\phi(l))\sim N(0, Q_\phi(l))$ and $p(v_\phi(l))\sim N(0, R_\phi(l))$. Here, we take $R_\phi(l) \sigma^2(l)$ to be the covariance associated with each measurement $z_\phi(l)$ and $Q_\phi$ is an estimate of the damage model error.

The process equations in Eqs (19) are nonlinear, and hence a nonlinear recursive filtering technique, such as extended Kalman filtering or unscented filtering, is required. Note that in this formulation, an additional refined estimate of the damage state is obtained, over and above the estimate that results from the damage tracker. This refinement is a possible because of the additional information contained in the model of Eq. (17).

Using Eq (17), the expression for the remaining useful life $t_F$ is obtained for a given a predefined failure surface $\phi(t+t_F) = \phi_F$ that will have the form $t_F(l) = z_F(\phi(l), \phi_F)$. For example, for the model of Eq. (17), this yields $$t_F(l) = \frac{\phi_F^{1-\alpha} - \phi(l)^{1-\alpha}}{\varepsilon(1-\alpha)}. \quad (20)$$

The actual time to failure estimation is then accomplished by the following discrete-time process and measurement equations:

$$t_F(l+1) = t_F(l) - \Delta t + w_F(l+1)$$
$$z_F(l+1) = t_F(l+1) + v_F(l+1), \quad (21)$$

where, again, $\Delta t = Mt_s = t_D$; $w_F$ and $v_F$ are white Gaussian distributions $p(w_F(l))\sim N(0, Q_F(l))$ and $p(v_F(l))\sim N(0, R_F(l))$, respectively. In this case, $R_F(l) (\varepsilon\phi^\alpha(l))^{-2}\sigma_\phi^2(l)$, where $\sigma_\phi^2(l)$ is the a posteriori variance for each $\phi(l)$.

Using this approach to estimate time to failure, Eqs. (21) are linear, and hence only a linear recursive estimation technique is needed (such as, for example, the Kalman filter). However, in some applications the quantity $R_F(l)$ may be difficult to estimate. Furthermore, in many situations, exact knowledge of $\phi$ is not important, and only time to failure is needed.

In these cases, a nonlinear recursive filter can be designed for direct time-to-failure estimation based on the damage model Eq (17) and the calculated tracking metric $e_k(l)$. For this case, Eq (17) is rewritten in terms of the tracking metric only, $$\frac{de_k}{dt} = \varepsilon e_k^\alpha, \quad (22)$$

that has solution $$e_k^{1-\alpha} = (1-\alpha)\varepsilon t + b, \quad (23)$$

where b is the constant of integration. Using Eq (7) and some preselected failure value for the tracking metric $e_F$, the expression for $e_k$ can be written in terms of time to failure variable $t_F$ as:

$$e_k = [(\alpha - 1)\varepsilon t_F + e_F^{1-\alpha}]^{\frac{1}{1-\alpha}}.  \quad (24)$$

Then the discrete-time time to failure process and tracking metric measurement equations are (with simply taken to be $z_F(l) \equiv e_k(l)$):

$$t_F(l+1) = t_F(l) - \Delta t + w_F(l+1), \quad (25)$$
$$z_F(l+1) = [(\alpha - 1)\varepsilon t_F(l+1) + e_F^{1-\alpha}]^{\frac{1}{1-\alpha}} + v_F(l+1).$$

where, $\Delta t = Mt_s = t_D$, again; $w_F$ and $v_F$ are white Gaussian distributions $p(w_F(l)) \sim N(0, Q_F(l))$ and $p(v_F(l)) \sim N(0, R_F(l))$, respectively. Here, $R_F(l) \sigma_e^2(l)$.

In this aspect of the general approach, Eqs (25) are now nonlinear, and hence it is necessary to use nonlinear recursive estimation techniques. However the quantity $R_F(l)$ may be more easily estimated.

Figure 2:
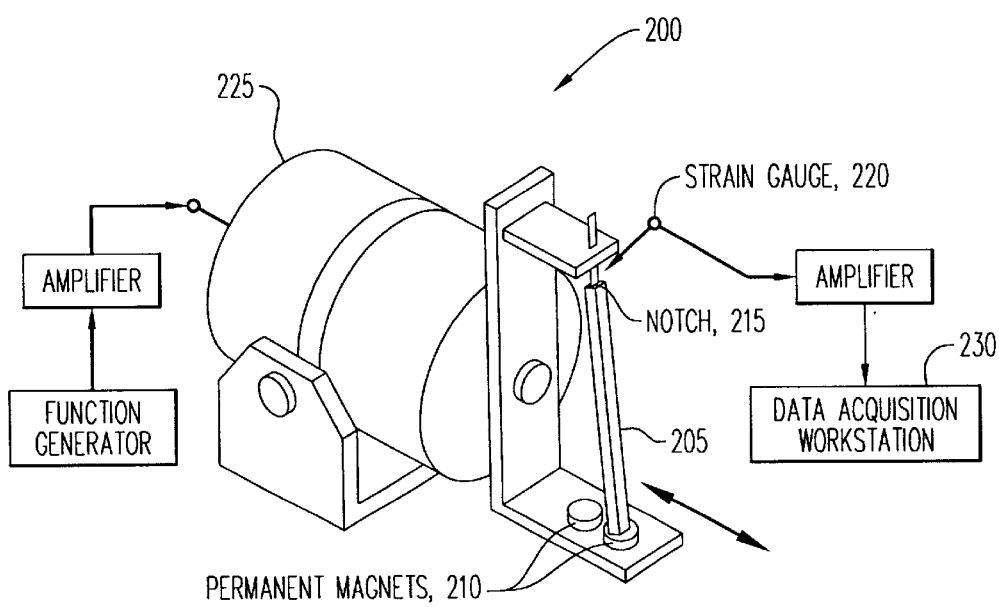
FIG. 2 is a depiction of an experimental set-up employed in accordance with the teachings of the present invention to predict the time-to-failure for a vibrating beam with a growing crack.

Experimental systems demonstrating and verifying the method discussed above have been realized by the inventors. As an illustrative example, an experimental system 200 is shown in FIG. 2. As shown, the experimental system is a modification of a standard two well magneto-mechanical oscillator. System 200 includes a cantilever beam 205 with stiffeners, and two permanent magnets 210 located near one end thereof for providing the two-well potential. A shallow notch 215 is made (e.g., filed) into beam 205 below a point where a strain gauge 220 is placed, preferably just above the stiffeners. System 200 is mounted on a shaker 225 and is forced at about 6 Hz. The forcing amplitude of shaker 225 was set to obtain chaotic output, however, as mentioned earlier, the methods of the present invention are not limited systems exhibiting chaotic behavior.

The crack in beam 205 slowly propagated starting from notch 215 for about 2.5 hours, until complete fracture was obtained. The output of strain gauge 220 is sampled at about a 100 Hz sampling frequency ($t_s=0.01$ sec), digitized (e.g., via a 12-bit A/D converter), and preferably stored, for example on a memory accessible by workstation. Delay time and embedding dimension were estimated to be $5t_s$ and 5, respectively. The first $2^{15}$ data points were used for the reference data set, and N=16 nearest neighbors were used for the local linear model parameter estimation. The estimated average pointwise dimension of the reference data set was $d_f=2.86$.

Throughout the experiment, system 200 underwent many bifurcations causing repeated periodic/chaotic transitions. Thus, loading on the crack was highly irregular, and often chaotic. After going through the embedding and modeling process, the inventors estimated the tracking function $e_5$ by calculating the STIRMOP, $E_5(l)$, of the reference model along with the distance $r_l$ between the point y(l) to the farthest of nearest neighbor points $y^r(l)$ used in modeling. A sample distribution of $|E_5(l)|$ is highly asymmetrical and is shown in the upper portion of FIG. 3. $|E_5(l)|$ can be approximated by a lognormal distribution.

Figure 3:
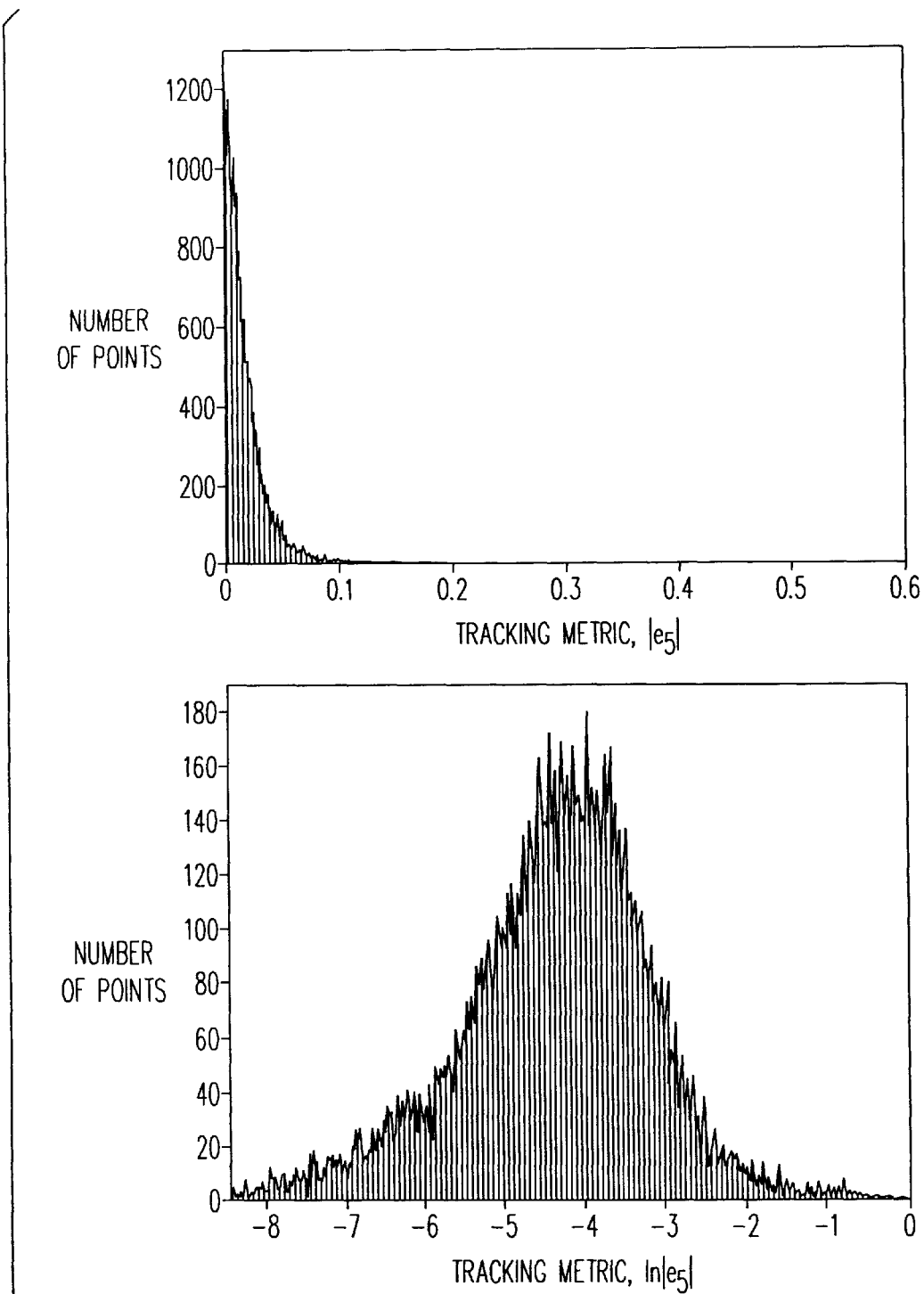
FIG. 3 is a depiction of $\|E_5\|$ for the system of FIG. 2 (upper graph), and the distribution of $\ln(\|E_5\|)$ (lower graph)

Indeed, taking a natural log of the absolute value of the tracking function, an approximately Gaussian distribution is obtained as shown in the lower portion of FIG. 3. Thus, to calculate the tracking function $e_5$, the Kalman filter of Eqs. (13) is applied to ln $|(||E_5(l)||)$ and the result yielded is transformed back using the exponential function. In this case, $R(l) = 10^3 r_l^{d_t}$ and $Q = 10^{-5}$ were used. Consecutive data records of $M=2^{12}$ points (with no overlapping sections or gaps between records) were used to calculate the mean and standard deviation in the estimate Eq. (16).

As discussed earlier, it is assumed that the form of empirical or analytical damage evolution law is known a priori. In the exemplary experimental case, in initial experiments it was observed that the reciprocal of estimated tracking metric $e_5$ was a linear function of time. This observation is consistent with a power law damage evolution of the form Eq. 17. Preliminary experiments were used to determine reasonable estimates of $\alpha$ and $\varepsilon$.

In the absence of independent damage state measurements to determine the parameters of Eq. (5), it was assumed that C=1 and c=0 for the linear measurement equation in Eqs. (19), corresponding to $z(k) \equiv e(k)$. Note, however, that if such independent data becomes available (or otherwise known), it can be easily incorporated into the procedure merely by changing C and c.

Using the process and measurement Eqs. (19) and the variant of the method as represented by Eqs. (20–21), the results for damage tracking (using a nonlinear unscented recursive filter) are shown in the upper portion of FIG. 4. The time-to-failure prediction results are shown in the lower portion of FIG. 4. For the calculations shown, $R_\phi(l) = 100\sigma_{e_5}^2(l)$, $Q_\phi = 10^{-2}$, $Q_F = 10^{-4}$, and $\phi_F = 0.13$.

Figure 4:
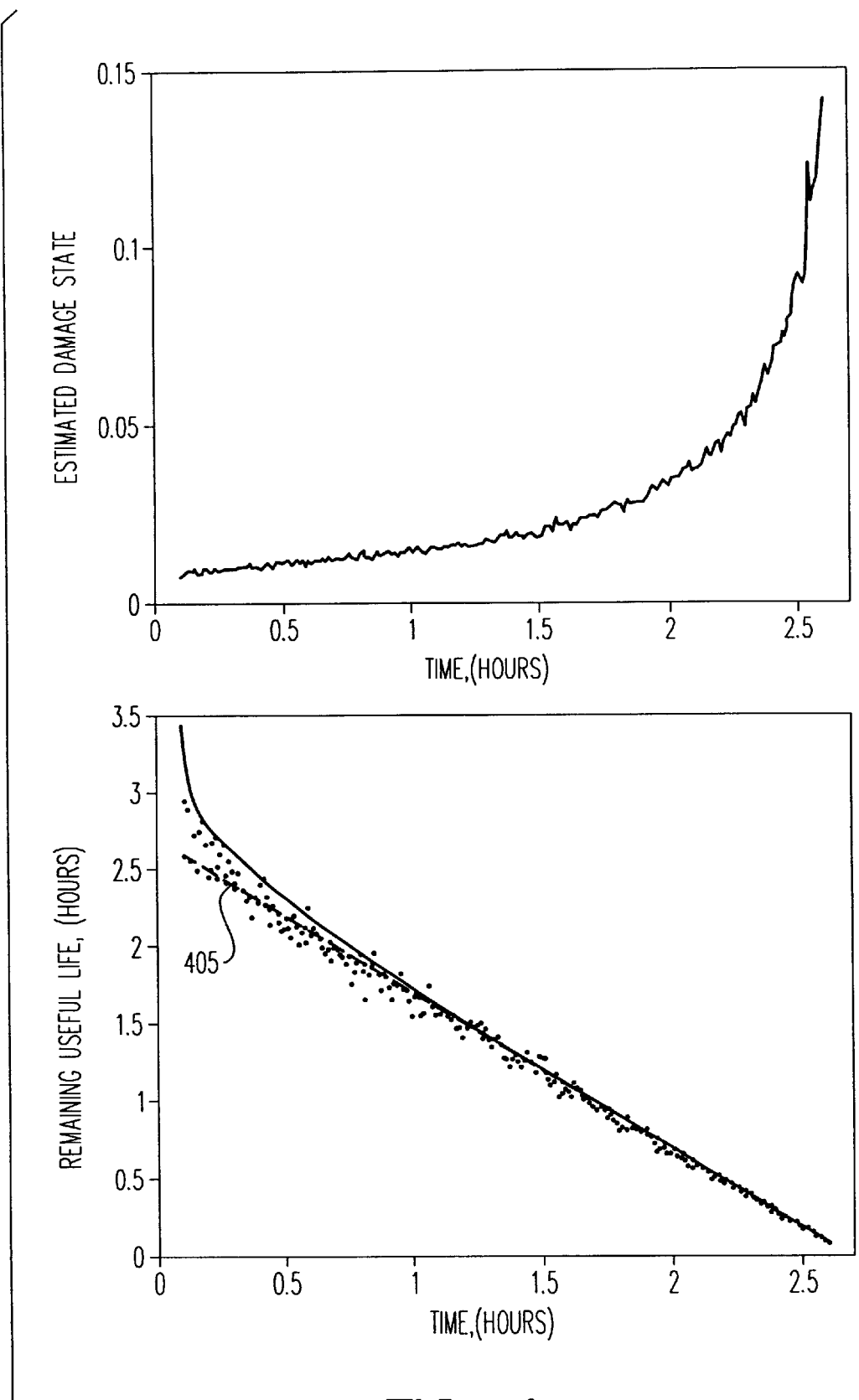
FIG. 4 is a depiction of the damage state estimation showing power law behavior (upper graph), and the time-to-failure predictions (lower graph) for the system of FIG. 2.

FIG. 4 clearly shows a power law trend in the estimated damage state evolution. Standard deviations for each estimate were too small to resolve in the plot. For fixed $\phi_F$ and using an initial estimate calculated by Eq. (20), the failure prediction aspects of the present invention were able to accurately converge to the a posteriori known time-to-failure line well in advance of the actual fracture in the beam, as indicated in the lower portion of FIG. 4. In the time-to-failure predictions, the thick solid line 405 indicates the true time to failure (known a posteriori). These results confirm the methods discussed herein, and provide an accurate predictor of the useful life remaining in the system.

The methods discussed herein are general purpose, since they are not tied to any specific damage physics. It assumes that the system possesses time scale separation, i.e., damage process occurs on a much slower time scale than the observable dynamics of a system. It is assumed implicitly that the fast subsystem is governed by some ordinary differential equation Eq. (1a). However, for failure prediction algorithm only a mathematical model for Eq. (1b) is required.

In summary, a description of the three major parts of the diagnostics/prognostics method, in accordance with the present invention, has been discussed above. In a first part, reference model construction and short-time reference model prediction error (STIRMOP) statistics were described. In a second part, a discussion of how STIRMOP statistics are used to estimate the change in the damage state of the system was presented. And, in the third part, a description of a prognostics module was discussed.

Figure 5:
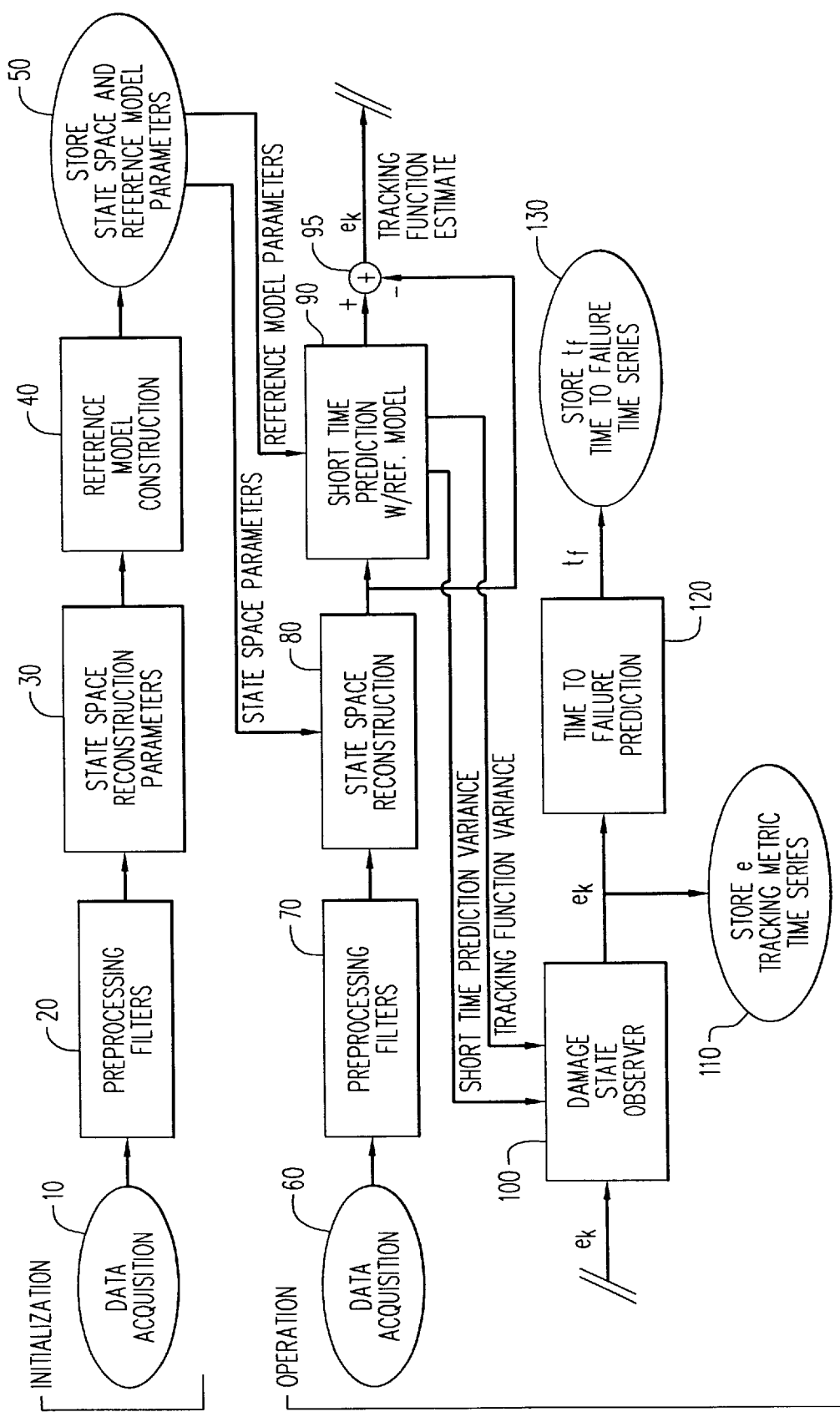
FIG. 5 is a depiction of an overall block diagram of the method of the present invention.

FIG. 5 depicts a high level block diagram encompassing the present invention. As part of an initialization process, data is collected in step 10 for construction of the reference model of the system being monitored for damage. Data collection 10 may include a variety of sensors, meters, and other data collection instruments and test set-ups for collecting the directly observable fast-time measurements (e.g., vibration frequencies). The raw data collected is optionally filtered by a preprocessing filter to extract a portion of the collected data at the frequencies pertinent to the damage process for the system. Preprocessing filter 20 may include one or more filters (e.g., bandpass, low pass, etc.), sampled at frequencies appropriate to yield the set of reference data sufficient to construct the reference model. The reference model should approximate the system operation for a healthy system (i.e., no damage, or $\phi=\phi_0$).

Using data from the reference configuration of the system, state space reconstruction is carried out as described above (using delay coordinate embedding or other methods, depending on the characteristics of the system). This results in a state space with appropriate dimension for the system. The reconstructed state space is then used for model parameter estimation 30 and modeling of the reference system 40 (using an approach that is appropriate for the system at hand, as described above). The state space and reference model parameters are stored in step 50 for use during the operation of the diagnostic and prognostic methods of the present invention.

During operation, data is acquired at step 60 and undergoes filtering by preprocessing filter 70. State space reconstruction 80 is analogous to state space reconstruction 30. The state space and reference model parameters stored at step 50 are used during state space reconstruction 80 and short time prediction 90, respectively, to compare the current damage state of the fast subsystem (data acquired at step 60) to the predictions of the reference model describing the fast subsystem as indicated at comparator 95.

The short-time reference model prediction (i.e., STIRMOP) error vector, $e_k$, is the output of comparator 95. The STIRMOP error vector $e_k$ is input into damage state observer 100 for each data point of the acquired data. Damage state observer 100 also takes in a short time prediction variance and a tracking function variance as inputs from the short time prediction module 90. Based on data from the entire data record input into damage state observer 100, the tracking metric $e_k$ is determined by the damage state observer 100. The tracking metric $e_k$ is preferably stored at step 110. The time to failure is determined by time to failure predictor 120 using a damage model for the system and the tracking metric $e_k$ to estimate the remaining time-to-failure.

The remaining time-to-failure can optionally be used to provide a warning of when the system is approaching a predetermined threshold for the remaining useful life of a system, without the need for removing the system from operation.

As discussed regarding the exemplary and illustrative system discussed above, the methods of the present invention were applied to a magneto-mechanical oscillator with a growing crack in the beam. As the crack grew, the system underwent many bifurcations causing repeated periodic/chaotic transitions. This resulted in a very complicated strain time series. Nevertheless, the method described herein smoothly tracked the accumulating damage. The results demonstrated that the present teachings are capable of predicting the failure time of a system (e.g., the beam) well in advance of the actual fracture.

It should be understood that the foregoing description is only illustrative of the present invention. Various alternatives and modification can be devised by those skilled in the art without departing from the present invention. For example, the method described in detail herein may be implemented using an apparatus, including a computer, for determining a slow damage state in a system having a time scale separation, the apparatus including a means for acquiring measurement data of a fast subsystem of said system, means for determining a tracking function for the system; and means for evaluating the tracking function using the acquired measurement data to determine a measure of the slowly evolving damage of the system. In an aspect of the present invention, the present invention may be implemented by a computer readable storage medium (e.g., a removable storage medium, a memory card or a hard disk) having program instructions embodied therein for executing the methods of the present invention. The computer readable storage medium can be read and the program instructions executed by a processor. Accordingly, the method of the present invention for determining the slowly evolving damage of the system may be implemented by an apparatus, including a computer or other suitable machine having a processor. As another example, for nonchaotic systems, stochastic interrogation can be used to generate the required points in state space, and for linear systems standard methods for linear system identification can be used. Accordingly, the present invention is intended to embrace all such alternatives, modification and variances.

What is claimed is:

1. A method for determining a slowly evolving damage state in a system having time scale separation, said method comprising:

acquiring measurement data of a fast subsystem of said system;

determining a tracking function for said system;

evaluating said tracking function using said acquired measurement data to determine a measure of said slowly evolving damage state of said system;

reconstructing a state space of said fast subsystem using said acquired data; and constructing a short time reference predictive model using parameters from said state space reconstruction.

2. The method of claim 1, wherein said tracking function is a short time reference model prediction error for said system.

3. The method of claim 1, comprising a step of estimating a remaining useful life of said system using said tracking function.

4. The method of claim 1, comprising a step of averaging a value of said tracking function for said system over said acquired data.

5. The method of claim 4, comprising a step of estimating a remaining useful life of said system using said averaged value of said tracking function.

6. The method of claim 5, wherein said estimate is determined using recursive filtering.

7. The method of claim 5, wherein said estimate is determined using a linear recursive filter.

8. The method of claim 5, wherein said estimate is determined using a nonlinear recursive filter.

9. The method of claim 1, wherein said method is independent of damage physics of said system.

10. The method of claim 1, wherein said slowly evolving damage state occurs on a much slower scale than a measurable characteristic of said fast system.

11. An apparatus for determining a slowly evolving damage state in a system having a time scale separation, said apparatus comprising:

means for acquiring measurement data of a fast subsystem of said system;

means for determining a tracking function for said system; and means for evaluating said tracking function using data acquired by said means for acquiring measurement data to determine a measure of said slowly evolving damage state of said system;

wherein said apparatus reconstructs a state space of said fast subsystem using said acquired data, and said apparatus constructs a short time predictive model using a parameter from said state space reconstruction.

12. The apparatus of claim 11, wherein said tracking function is a short time reference model prediction error for said system.

13. The system of claim 11, wherein said system estimates a remaining useful life of said system using said tracking function.

14. The apparatus of claim 11, wherein said apparatus averages a value of said tracking function for said system over said acquired data.

15. The apparatus of claim 14, wherein said apparatus estimates a remaining useful life of said system using said averaged value of said tracking function.

16. The apparatus of claim 15, wherein said estimate is determined using recursive filtering.

17. The apparatus of claim 15, wherein said estimate is determined using a linear recursive filter.

18. The apparatus of claim 15, wherein said estimate is determined using a nonlinear recursive filter.

19. The apparatus of claim 15, wherein said apparatus determines said slowly evolving damage state independently of damage physics of said system.

20. A storage medium having computer readable program instructions embodied therein for determining a slowly evolving damage state in a system having time scale separation, said storage medium comprising:

program instructions for acquiring measurement data of a fast subsystem of said system;

program instructions for determining a tracking function for said system;

program instructions for evaluating said tracking function using said acquired measurement data to determine a measure of said slowly evolving damage state of said system;

program instructions for reconstructing a state space of said fast subsystem using said acquired data; and program instructions for constructing a short time reference predictive model using parameters from said state space reconstruction.

* * * * *

UNITED STATES PATENT AND TRADEMARK OFFICE
CERTIFICATE OF CORRECTION

PATENT NO. : 6,567,752 B2 Page 1 of 1
DATED : May 20, 2003
INVENTOR(S) : Cusumano et al.

It is certified that error appears in the above-identified patent and that said Letters Patent is hereby corrected as shown below:

Column 1,
Line 6, after the date "Aug 15, 2000.", please insert the following:
-- This invention was made with support from the United States Government under Contract No. N00014-95-1-0461. The United States Government has certain rights in the invention. --

Signed and Sealed this

Fifth Day of April, 2005

JON W. DUDAS
*Director of the United States Patent and Trademark Office*